United States Patent [19]

Kondou et al.

[11] Patent Number: 4,810,995

[45] Date of Patent: Mar. 7, 1989

[54] ARITHMETIC AND LOGIC OPERATING UNIT

[75] Inventors: Harufusa Kondou; Hideki Ando, both of Hyogo, Japan

[73] Assignee: Mitsubishi Denki Kabushiki Kaisha, Tokyo, Japan

[21] Appl. No.: 21,666

[22] Filed: Feb. 9, 1987

[30] Foreign Application Priority Data

Feb. 13, 1986 [JP] Japan .................................. 61-31121

[51] Int. Cl.⁴ .............................................. G06F 7/02
[52] U.S. Cl. .................................. 340/146.2; 364/769
[58] Field of Search ...................... 364/736, 716, 769; 340/146.2

[56] References Cited

U.S. PATENT DOCUMENTS 3,434,109 3/1969 Coote .............................. 364/769 X
3,955,177 5/1976 Miller ............................. 340/146.2

OTHER PUBLICATIONS

Ho et al., "Comparator Compare 2's Complement Number", *Electronics,* Aug. 25, 1983, pp. 138–139.

Mano, "Digital Logic and Computer Design", Chapter 9, Published by Prentice Hall, Inc. 1979.

*Primary Examiner*—Gary V. Harkcom
*Assistant Examiner*—Tan V. Mai
*Attorney, Agent, or Firm*—Lowe, Price, LeBlanc, Becker & Shur

[57] ABSTRACT

An arithmetic and logic unit control circuit includes arithmetic circuits (10a–10d) for generating the absolute value |A| of an input signal A and the complement $\overline{B}$ of an input signal B from n-bit input signals A and B in response to a control signal from a controller (14). Full adders (6a–6d) add outputs from the arithmetic circuits in response to a control signal from the controller (14). First logic circuits (20a–20c, 21) extract the most significant bit of (|A|−B) to form outputs of the full adders (6a–6d) in response to a control signal from controller (14) and second logic circuits (20e, 21) to perform a three-level decision of values A and B from the outputs of the first logic circuits (20a–20c, 21) and the most significant bit of the input signal A. The arithmetic and logic unit can thereby perform Alternate Mark Inversion (AMI) coding in one machine cycle.

9 Claims, 4 Drawing Sheets

(B)

| (IAI-B)M | AM | DH | DL | D |
|---|---|---|---|---|
| 0 | 0 | 0 | 1 | 1 |
| 0 | 1 | 1 | 1 | -1 |
| 1 | 0 | 0 | 0 | 0 |
| 1 | 1 | 0 | 0 | 0 |

ARITHMETIC AND LOGIC OPERATING UNIT

BACKGROUND OF THE INVENTION

1. Field of the Invention

The present invention relates to an arithmetic and logic operating unit, and more particularly, it relates to the structure of an arithmetic and logic operating unit which can perform AMI (Alternate Mark Inversion) coding at a high speed.

2. Description of the Prior Art

AMI coding is the technique of comparing an input A with a predetermined threshold value B (B>0) by performing three-level decision of A>B, $|A|\leq B$ and A<−B and outputting a code responsive to the result of decision.

FIG. 1 illustrates an example of such AMI coding. Description is now concretely made on the AMI coding with reference to FIG. 1.

First, a predetermined threshold value B (where B>0) is compared with the value of an external input signal A at a given time. At this time, "1" is outputted if A>B, "0" is outputted if $|A|\leq B$ while "−1" is outputted if A<−B. The input signal A is thus subjected to AMI coding.

There is no existing arithmetic and logic unit (ALU) which can perform the three-level decision, i.e., AMI coding in one machine cycle. THerefore, the conventional ALU has coped with AMI coding through software.

FIG. 2 is a flow chart for illustrating an exemplary flow of software processing for AMI coding through the conventional ALU. In this flow chart, the absolute value of an input signal A is first obtained (step 1). Then a threshold value B is subtracted from the absolute value of the input signal A (step 2). Then a determination is made as to whether or not the result of subtraction ($|A|-B$) is positive (step 3). If the result is positive, the sign of the input signal A is outputted (steps 4 and 6), while "0" is outputted if the result is not positive (steps 5 and 6). The input signal A and the threshold value B are subjected to three-level decision through the aforementioned steps, whereby AMI coding of the input signal A is performed.

When such operation is performed by a general microprogram control system through the conventional ALU, a number of machine cycles are required for executing AMI coding since a plurality of times of arithmetics and condition judgements etc. are included, whereby the operation cannot be performed at a high speed.

The general procedure for designing the arithmetic and logic unit in the background of the present invention is disclosed in "Digital Logic and Computer Design" by M. Morris Mano, Chap. 9, published by Prentice Hall, 1979, which is translated and published in Japan by Kyoritsu Shuppan.

SUMMARY OF THE INVENTION

It is an object of the present invention to overcome the disadvantage of the conventional arithmetic and logic unit and provide an operating unit for arithmetics and logics which can perform AMI coding in one machine cycle.

The operating unit for arithmetics and logics according to the present invention includes a controller which is responsive to external arithmetic mode indicating signals for generating first, second and third internal control signals in corresponding patterns. An arithmetic and logic circuit generates the absolute value $|A|$ of an input signal A and the complement $\overline{B}$ of an input signal B from the input signals A and B in response to the first internal control signal. An adder performs addition of the absolute value $|A|$ and the complement $\overline{B}$ in response to the second internal control signal. A first extraction circuit extracts the most significant bit of the output from the adder in response to the third internal control signal. An output circuit performs a three-level decision of of A>B, $|A|\leq B$ and A<−B (B>0) through the most significant bit of the input signal A and the output from the first extractor and outputs the result.

The adder calculates $|A|+\overline{B}+1=A-B$ and supplies the results as an output when A>0. When A<0 the adder calculates the term $\overline{A}+\overline{B}+1$ as follows $|A|+\overline{B}+1=-A+\overline{B}+1=(\overline{A}+\overline{B}+1)+1$, using the signals $|A|$ and $\overline{B}$ with the second internal control signal used as the least significant carry input. The first extractor extracts the most significant bit of $A+\overline{B}+1$ when A>0 while adding "1" and extracting the most significant bit of $(\overline{A}+\overline{B}+1+1)$ when A<0. Thus, the first extractor extracts the most significant bit of $|A|-B$, i.e., the sign of $|A|-B$. The second extraction means extracts the result of three-level decision of A>B, $|A|\leq B$ and A<−B (where B<0) through the sign of $|A|-B$ and the most significant bit of the input A, i.e., the sign of the input signal A, thereby to output the AMI code of the input A.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5, FIGS. 5A & 5B, is a block diagram functionally showing the operation of the operating unit for arithmetics and logics according to the present invention.

DESCRIPTION OF THE PREFERRED EMBODIMENT

Figure 3:
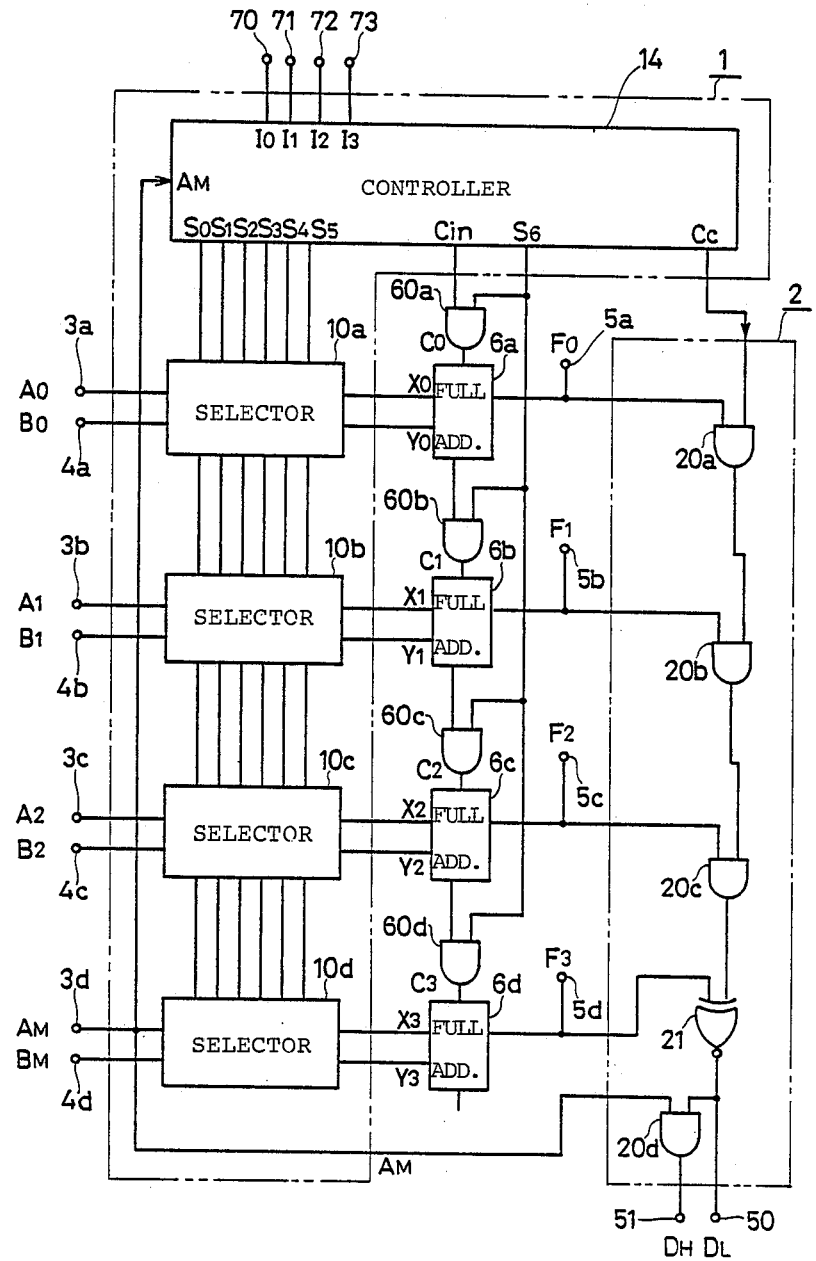
FIG. 3 illustrates the structure of an operating unit for arithmetics and logics according to an embodiment of the present invention.

FIG. 3 is a block diagram showing the structure of an operating unit for arithmetics and logics according to an embodiment of the present invention, in which both of input signals A and B are in 4-bit structure, for example.

Referring to FIG. 3, an operating unit AL for arithmetics and logics includes a control circuit 1 for performing predetermined processing on input signals received in input terminals 3a, 3b, 3c, 3d, 4a, 4b, 4c and 4d, and outputting the same in response to signals $I_0$, $I_1$, $I_2$ and $I_3$ supplied to input terminals 70, 71, 72 and 73 for designating types of arithmetics and an auxiliary arithmetic circuit 2 employed in AMI coding to provide an AMI-coded output D of the input signal A with the input signal B being received as a threshold value input.

The control circuit 1 is formed by a controller 14 which generates control signals $S_0$, $S_1$, $S_2$, $S_3$, $S_4$ and $S_5$ of predetermined patterns to supply the same to selectors 10a to 10d while supplying control signals $C_{in}$ and $S_6$ to an AND gate 60a and a control signal $C_c$ to a first input of an AND gate 20a of the auxiliary arithmetic circuit 2 in response to the arithmetic mode indicating signals $I_0$ to $I_3$ supplied to respective ones of the input terminals 70 to 73 and the most significant bit $A_M$ of the input signal A and selectors 10a, 10b, 10c and 10d for performing predetermined arithmetics on the input signals A and B to transfer the same to full adders 6a to 6d respectively in response to internal control signals from the controller 14. The selector 10a receives the least significant bits $A_0$ and $B_0$ of the input signals A and B through the input terminals 3a and 4b. The selector 10b receives second low order bits $A_1$ and $B_1$ through the input terminals 3b and 4b. The selector 10c receives third low order bits $A_2$ and $B_2$ through the input terminals 3c and 3d. The selector 10d receives the most significant bits $A_M$ and $B_M$ of the input signals A and B through the input terminals 3d and 4d.

Figure 4:
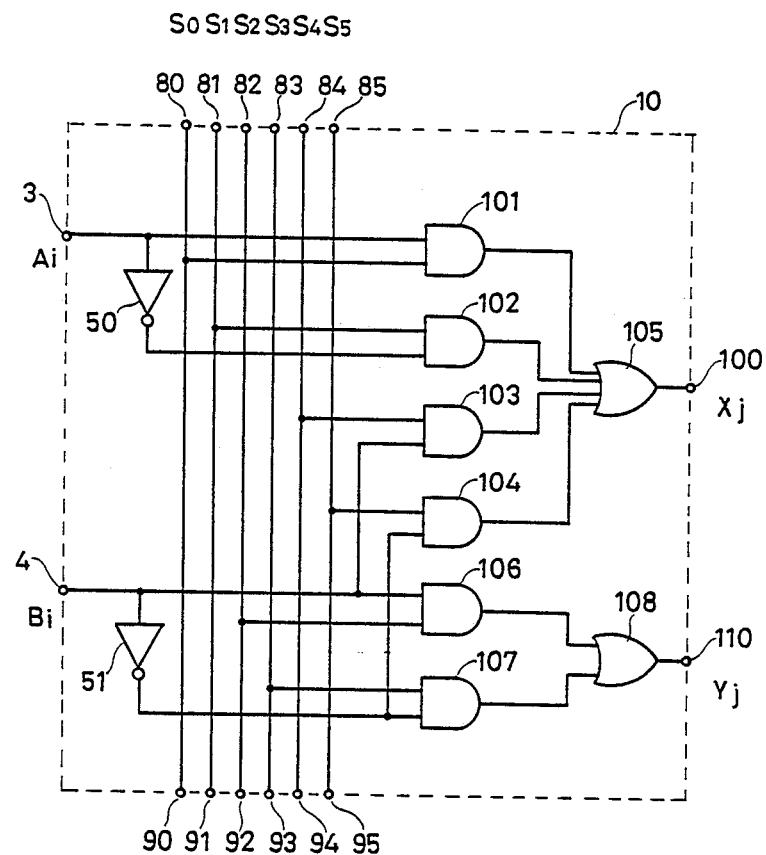
FIG. 4 is a circuit diagram showing concrete structure of a selector as shown in FIG. 3.

FIG. 4 is a logic diagram showing concrete structure of a selector. The selectors 10a to 10d are identical in structure to each other.

Referring to FIG. 4, a selector 10 includes an AND gate 101 which obtains the logical product of an input signal $A_i$ supplied through an input terminal 3 and an internal control signal $S_0$ supplied through an input terminal 80 to output the same, an AND gate 102 which obtains the logical product of an inverted value of the input signal $A_i$ received through an inverter 50 and an internal control signal $S_1$ received through an input terminal 81 to output the same, an AND gate 103 which obtains the logical product of an input signal $B_i$ received through an input terminal 4 and an internal control signal $S_4$ received through an input terminal 84 to output the same, an AND gate 104 which obtains the logical product of an inverted value of the input signal $B_i$ received through an inverter 51 and an internal control signal $S_5$ received through an input terminal 85 to output the same and an OR gate 105 which obtains the logical sum of the outputs from the AND gates 101, 102, 103 and 104 to generate an output signal $X_j$ from an output terminal 100, as an $X_j$ output system. An output system for an output signal $Y_j$ from an output terminal 110 is formed by an AND gate 106 which obtains the logical product of the input signal $B_i$ received through the input terminal 4 and an internal control signal $S_2$ received through an input terminal 82 to output the same, an AND gate 107 which obtains the logical product of an inverted value of the input signal $B_i$ through the inverter 51 and an internal control signal $S_3$ received through an input terminal 83 to output the same and an OR gate 108 which obtains the logical sum of the output signals received from the AND gates 106 and 107 to generate the output signal $Y_j$ from the output terminal 110. The function of the selector 10 responsive to the internal control signals $S_0$ to $S_5$ will be hereinafter described, while the input signals $A_i$ and $B_i$ are directly outputted as the output signals $X_j$ and $Y_j$ when (101000) is supplied as $S_0$ to $S_5$.

The auxiliary arithmetic circuit 2 for generating the AMI code in response to the control signal $C_c$ from the controller 14 is formed by four AND gates 20a, 20b, 20c and 20d and an XNOR gate 21. The AND gate 20a obtains the logical product of the output from the full adder 6a and the control signal $C_c$ from the controller 14 to supply the same to a first input of the AND gate 20b. The AND gate 20b obtains the logical product of the output from the full adder 6b and the output from the AND gate 20a to supply the same to a first input of the AND gate 20c. The AND gate 20c obtains the logical product of the output from the full adder 6c and the output from the AND gate 20b to supply the same to a first input of the XNOR gate 21. The XNOR gate 21 judges coincidence/non-coincidence of the output from the full adder 6d and the output from the AND gate 20c to supply an "H" signal to a first input of the AND gate 20d upon judgement of coincidence while outputting the same as a low order bit $D_L$ of the AMI code from an output terminal 50. The AND gate 20d obtains the logical product of the most significant bit $A_M$ of the input signal A and the output from the XNOR gate 21 to output the same as a high order bit $D_H$ of the AMI code from an output terminal 51.

The full adders 6a, 6b, 6c and 6d are provided between the selectors 10a to 10d and the auxiliary arithmetic circuit 2 to receive the respective output signals from the selectors 10a to 10d and add up the same.

The full adder 6a performs addition of outputs $X_0$ and $Y_0$ from the selector 6a and a carry input $C_0$ to output the result $F_0$ from an output terminal 5a while supplying the same to a second input of the AND gate 20a. The carry $C_0$ is supplied by the AND gate 60a which receives the internal control signals $C_{in}$ and $S_6$ from the controller 14 to obtain the logical product thereof and output the same. The full adder 6b performs addition of outputs $X_1$ and $Y_1$ from the selector 10b and a carry input $C_1$ to output the result $F_1$ from an output terminal 5b while supplying the same to a second input of the AND gate 20b. The carry $C_1$ is supplied by an AND gate 60b which obtains the logical product of the carry output of the full adder 6a and the control signal $S_6$ to output the same. The full adder 6c performs addition of outputs $X_2$ and $Y_2$ from the selector 10c and a carry input $C_2$ to output the result $F_2$ from an output terminal 5c while supplying the same to a second input of the AND gate 20c. The carry $C_2$ is supplied by an AND gate 60c which obtains the logical product of the carry output from the full adder 6b and the control signal $S_6$. The full adder 6d performs addition of outputs $X_3$ and $Y_3$ from the selector 10d and a carry input $C_3$ to output the result $F_3$ from an output terminal 5d while supplying the same to a second input of the XNOR gate 21. The carry $C_3$ is supplied by an AND gate 60d which obtains the logical product of the carry output from the full adder 6c and the control signal $S_6$.

Description is now made on the operation of this embodiment.

When the operating unit AL performs AMI coding, A is employed as an input signal and B is employed as a threshold value. The functions of the operating unit AL are set by the mode indicating signals $I_0$ to $I_3$ supplied to the input terminals 70 to 73. All of inputs, outputs and AMI codes of the operating unit AL are provided in binary numbers, and negative numbers are expressed by two's complements. For example, "1" of the AMI code is expressed as 01, while "−1" is expressed as 11 and "0" is expressed as 00. In this expression method, the most significant bit of an input indicates whether the value of the input is positive or negative. With reference to the input A, for example, A is negative if $A_M=1$ while A is positive if $A_M=0$, where $A_M$ is the most significant bit of A. In order to invert the sign of a numerical value, "1" may be added to the complement of the said numerical value. For example, if the complement of B is expressed as $\bar{B}$, $$-B = \bar{B} + 1$$

Figure 1:
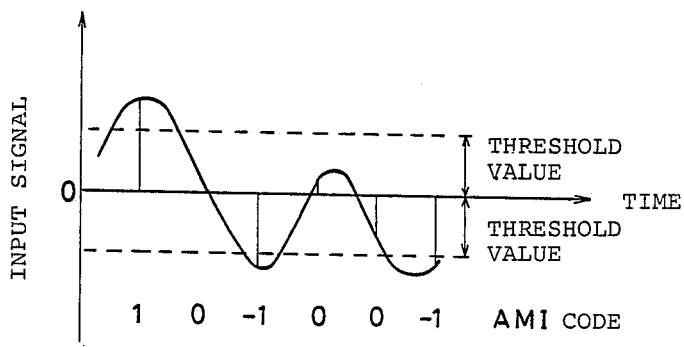
FIG. 1 illustrates the technique of AMI coding.
Figure 2:
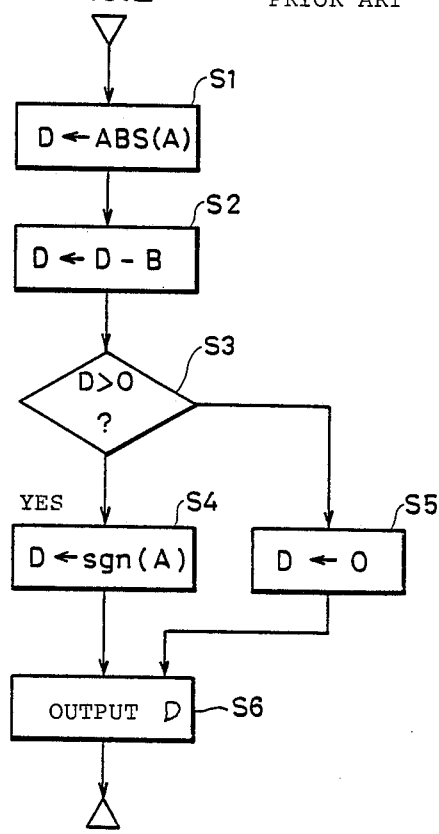
FIG. 2 is a flow chart showing steps for performing AMI coding through software.

It is assumed here that A represents an input signal to be coded and B represents a threshold value for reference. It is obvious from the flow chart as shown in FIG. 2 that the following decision may be performed in order to execute AMI coding. Assuming that D represents the AMI code, If $|A| - B \leq 0$, then $D = 0$            (1)

If $|A| - B > 0$ and $A > 0$, then $D = 1$     (2)

If $|A| - B > 0$ and $A > 0$, then $D = -1$    (3)

Figure 5:
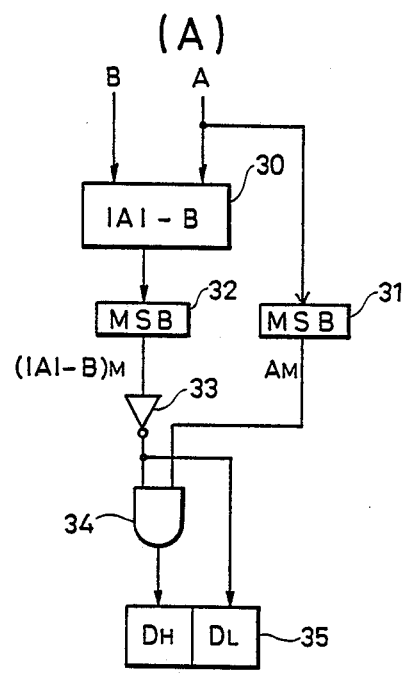

FIG. 5 illustrates functional hardware structure for performing the aforementioned decision in consideration of characteristics of the binary numbers expressed in two's complement representation. In this representation mode, positive/negative decision of $|A| - B$ and A can be easily performed by referring to the values of the most significant bit ($|A| - B)_M$ of $|A| - B$ and the most significant bit $A_M$ of the input signal A. FIG. 5(B) shows the relation between the aforementioned expressions (1) to (3) expressed through the most significant bits $(|A| - B)_M$ and $A_M$. FIG. 5(A) shows the structure of the hardware formed on the basis of the table as shown in FIG. 5(B). In the structure as shown in FIG. 5(A), an AMI coding unit is formed by a first arithmetic part 30 for performing arithmetic of $|A| - B$ through the input signal A and the threshold value input B, a second arithmetic part 31 for extracting the most significant bit $A_M$ of the input signal A, a third arithmetic part 32 for receiving the output from the first arithmetic part 30 to extract the most significant bit $(|A| - B)_M$ thereof, an inverter 33 for receiving the output from the third arithmetic part 32 to invert and transfer the same, an AND gate 34 for receiving the output from the inverter 33 and the output from the second arithmetic part 31 to obtain the logical product thereof and output the same and an output part 35 for receiving the output from the inverter 33 as a low order bit $D_L$ and the output from the AND gate 34 as a high order bit $D_H$. The AMI code is supplied by $(D_H D_L) = D$. It is obvious from the structure of FIG. 5(A) that AMI coding can be executed in one machine cycle when the arithmetic of $|A| - B$ in the first arithmetic part 30 can be performed in one machine cycle. Then, consider the arithmetic of $|A| - B$.

In the case of $A \geq 0$, $$|A| - B = A - \bar{B} = A + \bar{B} + 1 \tag{4}$$

whereby the expression (4) can be performed if the inputs in the full adders 6a to 6d are A and $\bar{B}$ and if the carry input $C_0$ in the full adder 6a is "1", in the structure as shown in FIG. 3.

In the case of $A < 0$, $$|A| - B = -A - B = \bar{A} + B + 1 + 1 \tag{5}$$

However, the result of the expression (5) cannot be extracted in the outputs of the full adders 6a to 6d in one machine cycle. Therefore, the expression (5) is executed in two steps as follows:

$$\bar{A} + \bar{B} + 1 + 1 = (\bar{A} + \bar{B} + 1) + 1 \tag{6}$$

Namely, $(\bar{A} + \bar{B} + 1)$ can be extracted from the full adders 6a to 6d in one machine cycle if the inputs in the full adders 6a to 6d are $\bar{A}$ and $\bar{B}$ and if the carry input $C_0$ in the full adder 6a is "1". Thus, a desired result of calculation can be obtained at a high speed by adding "1" to the output $(\bar{A} + \bar{B} + 1)$ from the full adders 6a to 6d through the auxiliary arithmetic circuit 2.

In summary of the aforementioned discussion, it is recognized that the inputs X and Y in the full adders 6a to 6d, the carry control signal $C_{in}$ and the internal control signal $S_6$ from the controller 14 and the internal control signal $C_c$ to the auxiliary arithmetic circuit 2 may be set as shown in Table 1 in the structure of FIG. 3, in order to perform AMI coding in one machine cycle.

TABLE 1

| Sign of A | $A_M$ | X | Y | $C_{in}$ | $S_6$ | $C_c$ |
|---|---|---|---|---|---|---|
| positive | 0 | A | $\bar{B}$ | 1 | 1 | 0 |
| negative | 1 | $\bar{A}$ | $\bar{B}$ | 1 | 1 | 1 |

In the structure of FIG. 3, the control circuit 1 controls the selectors 10a to 10d, the carry of the full adders 6a to 6d and the auxiliary arithmetic circuit 2 through the control signals $S_0$ to $S_6$, $C_{in}$ and $C_c$ to satisfy the setting in Table 1 in AMI coding. Table 2 shows correspondence between the internal control signals $S_0$ to $S_6$, $C_{in}$ and $C_c$ generated by the controller 14 and the functions of the operating unit AL. The functions of the operating unit AL are selected by the mode indicating signals $I_0$ to $I_3$ to the control circuit 1. The controller 14 can be easily formed by PLA (programmable logic array) or the like to satisfy the correspondence as shown in Table 2, by previously setting correspondence between the combinations of the input signals $I_0$ to $I_3$ and the functions of the operating unit AL.

TABLE 2

| Function | X | Y | Cin | $S_0$ | $S_1$ | $S_2$ | $S_3$ | $S_4$ | $S_5$ | $S_6$ | $C_c$ |
|---|---|---|---|---|---|---|---|---|---|---|---|
| A + B | A | B | 0 | 1 | 0 | 1 | 0 | 0 | 0 | 1 | X |
| A − B | A | $\bar{B}$ | 1 | 1 | 0 | 0 | 1 | 0 | 0 | 1 | X |
| −A + B | $\bar{A}$ | B | 1 | 0 | 1 | 1 | 0 | 0 | 0 | 1 | X |
| A + 1 | A | 0 | 1 | 1 | 0 | 0 | 0 | 0 | 0 | 1 | X |
| A − 1 | A | all 0 | 0 | 1 | 0 | 1 | 1 | 0 | 0 | 1 | X |
| A | A | 0 | 0 | 1 | 0 | 0 | 0 | 0 | 0 | X | X |
| −A | $\bar{A}$ | 0 | 1 | 0 | 1 | 0 | 0 | 0 | 0 | 1 | X |
| \|A\| | $A \geq 0 \ldots A$ $A < 0 \ldots \bar{A}$ | 0 | $A_M$ | $\bar{A}_M$ | $A_M$ | 0 | 0 | 0 | 1 | X |
| A ⊕ B | A | B | X | 1 | 0 | 1 | 0 | 0 | 0 | 0 | X |
| A B | A | $A + \bar{B}$ | X | 1 | 0 | 0 | 1 | 0 | 1 | 0 | X |
| A B | A | $A + B$ | 0 | X | 1 | 0 | 0 | 0 | 1 | 0 | 0 | X |
| AMI | $A \geq 0 \ldots A$ | $\bar{B}$ | 1 | $A_M$ | $\bar{A}_M$ | 0 | 1 | 0 | 0 | 1 | $A_M$ |

TABLE 2-continued

| Function | X | Y | Cin | S₀ | S₁ | S₂ | S₃ | S₄ | S₅ | S₆ | C_c |
|---|---|---|---|---|---|---|---|---|---|---|---|
| A < 0 . . . A | | | | | | | | | | | |

X: Don't Care

The auxiliary arithmetic circuit 2 for extracting the most significant bit $(|A|-B)_M$ of $|A|-B$ has only to calculate the sign as the result of arithmetic $(|A|-B)$, i.e., the most significant bit as obvious from FIG. 5. Thus, the auxiliary arithmetic circuit 2 is formed only by the AND gates and the XNOR gate to calculate only the carry of the outputs from the respective full adders 6a to 6d. Namely, the XNOR gate 21 outputs the complement $\overline{(|A|-B)}_M$ of the most significant bit.

Thus, the operating speed is increased and the AMI code can be calculated in a short time if all of the outputs from the full adders 6a and 6d are defined. In the auxiliary arithmetic circuit 2, the internal control signal $C_c$ is set at zero when the input A is positive, and the AMI code is calculated by directly employing the outputs $F_0$ to $F_3$ of the full adders 6a to 6d. When the input A is negative, the internal control signal $C_c$ is set at "1" and the AMI code is calculated by adding "1" to the outputs from the full adders 6a to 6d. Thus, the sign of the input A is determined by the value of the most significant bit $A_M$ in case of the two's complement representation, whereby the aforementioned relation is satisfied by employing the most significant bit $A_M$ as the internal control signal $C_c$.

As hereinabove described, AMI coding can be performed in one machine cycle according to the aforementioned embodiment.

Although the above embodiment has been described with reference to a 4-bit operating unit, an effect similar to the above can be attained with any bit number. The control circuit 1 in the aforementioned embodiment may be in different structure so far as the same can perform such control as shown in Table 1 in AMI coding. Further, while the auxiliary arithmetic circuit 2 in the aforementioned embodiment is formed by four AND gates and one XNOR gate, the same can be formed in other combinations of logical gates to attain an effect similar to the above so far as the same performs similar logical operations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An arithmetic and logic unit for performing arithmetic and logic operations on externally supplied first digital input signal A and second digital input signal B in response to arithmetic mode indicating signals, and outputting a result thereof, said arithmetic and logic unit comprising:

control means (14) for generating first ($S_0$-$S_5$), second ($C_{in}$, $S_6$) and third ($C_c$) internal control signals in response to said arithmetic mode indicating signals;

selector means (10a-10d) for generating an absolute value of said first input signal A and a complement $\overline{B}$ of said second input signal B from said input signals A and B in response to said first internal control signals ($S_0$-$S_5$) from said control means (14);

adder means (6a-6d) for adding said absolute value $|A|$ and said complement $\overline{B}/$ from said arithmetic means (10a-10d) in response to said second internal control signals ($C_{in}$, $S_6$) from said control means (14);

first extraction means (2, 20a-20c, 21) for extracting a most significant bit of output from said adder means (6a-6d) in response to said third internal control signals ($C_c$) from said control means (14);

second extraction means (3d) for extracting a most significant bit of said first input signal A; and output means (2, 20d, 21) for outputting a result signal responsive to a result of a three-level decision corresponding to a>B, $|A|\leq B$ and A<−B (where B>0), said result signal including an output of said first extraction means (2, 20a-20c, 21) and an output from said second extraction means (3d).

2. An arithmetic and logic unit in accordance with claim 1, wherein both of said input signals A and B are binary numbers expressed in two's complement representation.

3. An arithmetic and logic unit in accordance with claim 1, wherein said adder means comprises full adders having carry inputs enabled responsive to said second internal control signals ($C_{in}$, $S_6$).

4. An arithmetic and logic unit in accordance with claim 1, wherein said first extraction means calculates the carries of respective additions of said third internal control signal ($C_c$) and said outputs of said adder means.

5. An arithmetic and logic unit in accordance with claim 1, wherein said third internal control signal ($C_c$) is a most significant bit of said first input signal A.

6. An arithmetic and logic unit in accordance with claim 1, wherein said first internal control signals ($S_0$-$S_5$) include a value of a most significant bit of said first input signal A.

7. An arithmetic and logic unit in accordance with claim 1, wherein said first extraction means is formed by cascade-connected AND gates (20a, 20b, 20c) and an XOR gate (21) of the final stage.

8. An arithmetic and logic unit in accordance with claim 1, wherein said output means comprises an XNOR gate (21) and an AND gate (20d) receiving an output from said XNOR gate and a most significant bit of said first input signal A from said second extraction means.

9. An arithmetic and logic unit in accordance with claim 8, wherein said output means outputs the output from said XNOR gate (21) as a lower order bit and the output from said AND gate (20d) as a higher order bit.

* * * * *